United States Patent [19]

Huang et al.

[11] Patent Number: 4,947,226

[45] Date of Patent: Aug. 7, 1990

[54] BILATERAL SWITCHING DEVICE

[75] Inventors: Jack S. T. Huang, Plymouth; Per N. Forssell, Minneapolis, both of Minn.

[73] Assignee: Hoenywell, Inc., Minneapolis, Minn.

[21] Appl. No.: 319,831

[22] Filed: Mar. 3, 1989

Related U.S. Application Data

[63] Continuation of Ser. No. 130,143, Dec. 8, 1987, abandoned.

[51] Int. Cl.⁵ .................. H01L 29/74; H01L 29/747; H01L 27/02
[52] U.S. Cl. .......................... 357/38; 357/30; 357/39; 357/43
[58] Field of Search ...................... 357/23.4, 30, 39, 43

[56] References Cited

U.S. PATENT DOCUMENTS

| | | | |
|---|---|---|---|
| 4,001,860 | 1/1977 | Cauge et al. | 357/23.4 |
| 4,199,774 | 4/1980 | Plummer | 357/43 |
| 4,296,426 | 10/1981 | Gilles | 357/23.4 |
| 4,558,243 | 12/1985 | Schutten et al. | 307/584 |
| 4,574,207 | 3/1986 | Benjamin et al. | 307/577 |
| 4,574,208 | 3/1986 | Lade et al. | 307/577 |
| 4,574,209 | 3/1986 | Lade et al. | 357/43 |
| 4,612,465 | 9/1986 | Schutten et al. | 307/584 |
| 4,622,568 | 11/1986 | Schutten et al. | 307/23.4 |
| 4,622,569 | 11/1986 | Lade et al. | 357/23.4 |
| 4,639,754 | 1/1987 | Wheatley et al. | 357/23.4 |
| 4,641,175 | 2/1987 | Shiraishi | 357/39 |

OTHER PUBLICATIONS

"The Insulated Gate Rectifier(IGR): A New Power Switching Device," B. Baliga, M. Adler, P. Gray, R. Love, Idem 82, pp. 264–267.

"The COMFET-A New High Conductance MOS--Gated Device," J. Russell, A. Goodman, L. Goodman, J. Neilson, IEEE Electron Device Letters, vol. EDL-4, No. 3, Mar. 1983, pp. 63–65.

"Lateral Resurfed COMFET," Electronics Letters, 7 Jun. 1984, vol. 20, No. 12, pp. 519–520, M. Darwish et al.

"n-Channel Lateral Insulated Gate Transistors: Part I—Steady-State Characteristics," D. Pattanayak, A. Robinson, T. Chow, M. Adler, B. Baliga, E. Wildi, IEEE Transactions on Electron Devices, vol. ED-33, No. 12, 12/1986, pp. 1956–1963.

Primary Examiner—Rolf Hille
Assistant Examiner—Wael Fahmy
Attorney, Agent, or Firm—Kinney & Lange

[57] ABSTRACT

A bilateral switch device capable of conducting a current therethrough established by a first control signal and ended by an alternate control signal and having a low "on" resistance.

30 Claims, 3 Drawing Sheets

BILATERAL SWITCHING DEVICE

This is a continuation of application Serial No. 130,143, filed Dec. 8, 1987, now abandoned.

BACKGROUND OF THE INVENTION

The present invention relates to semiconductor device structures for switching substantial currents, especially in monolithic integrated circuits, between the states of flowing and not flowing without requiring signal power to maintain the current flowing state and, more particularly, to such device structures where currents flow therethrough in a substantially lateral direction with respect to a surface.

There is an increasing need to control flows of currents of substantial values in monolithic integrated circuits. This comes about primarily because of the desire for "smart" power control - the use of a monolithic integrated circuit with substantial logic or sensing capabilities, or both, to control flows of currents to external devices. The currents drawn by external devices are usually much greater than the signal currents used in monolithic integrated circuits and, in many situations, are orders of magnitude greater than integrated circuit signal currents.

Various kinds of devices have been used as switches to control the initiations and cessations of such higher valued currents in descrete devices and in monolithic integrated circuits. Bipolar transistors have been used to control such higher valued currents, for instance. However, solving problems of thermal "runaway," emitter current crowding and second breakdown lead to devices which take a relatively large amount of area in a monolithic integrated circuit device. In addition, the storage of charge in the base of a bipolar transistor puts a lower limit on the time in which cessation, or switching "off," of a current flowing therethrough can be accomplished. Further, bipolar transistors have a relatively low input impedance.

Metal-oxide-semiconductor field-effect transistors (MOSFET's) have also been used as switches to control the flow of substantial currents because they provide short times for switching off current flows therethrough due to the absence of any charge storage. Furthermore, the negative temperature dependence of the output current eliminates the possibility of thermal "runaway," i.e. an increase in output current with increasing temperatures, a characteristic of bipolar transistors mentioned above. MOSFET's generally have a high input impedance, and therefore a high current gain. A MOSFET power transistor is convenient in integrated circuits where the other active circuit components used in the control logic portion are also MOSFET's, which is often the case. However, the "on" resistance value of a MOSFET is low but not as low as that of a bipolar transistor of the same device area. Further, the "on" resistance of a MOSFET is likely to increase in device designs with higher breakdown voltage capabilities because of design tradeoffs to reach such breakdown voltages.

The value resulting for the "on" resistance in such a switching device is an important consideration. The higher the value of the "on" resistance which occurs for a given current flowing through a current control switching device, the higher the voltage drop across that device between the terminals carrying this flow. This voltage is not available to be provided across the external device to which the current flow is being controlled which, in circuits using small voltage value power supplies as is common in integrated circuits, may be a very difficult characteristic to accept. In addition, especially in integrated circuit chips, the larger the value of the "on" resistance, the greater the power dissipation occurs within the chip which causes the chip to heat. This result may adversely affect other circuit components provided in such an integrated circuit chip. Thus, there is a substantial desire to have a current control switch exhibit as small an "on" resistance as possible.

A further consideration in connection with monolithic integrated circuits having control logic or sensing, or both, provided in common with a power MOSFET in the chip, is the desire to have currents controlled by this power MOSFET flow more or less along that surface of the chip in which the logic devices are also located rather than through the substrate to the opposite side of the chip. Such an arrangement greatly eases the difficulty in making circuit interconnections between the logic devices and the power MOSFET and, in those instances when alternating currents are to be controlled, greatly eases the difficulties in operating the logic or sensing portions of the monolithic integrated circuit chip.

Figure 1:
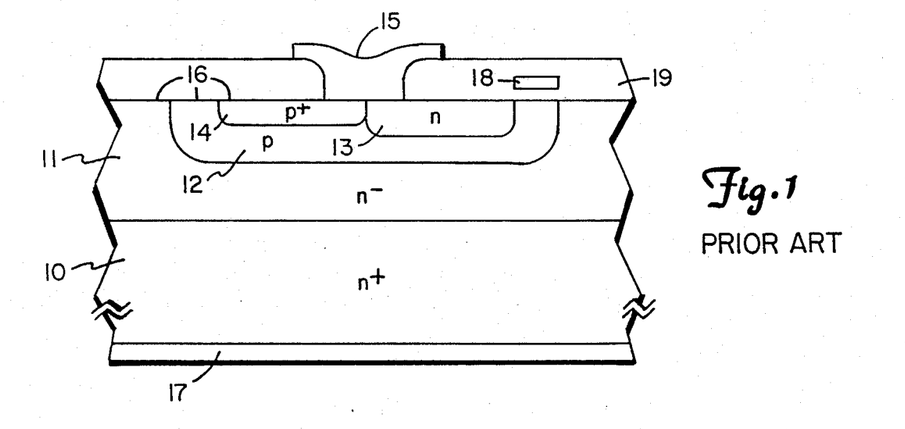
FIG. 1 shows a representation of a field-effect transistor device known in the prior art.

A typical MOSFET device is shown in FIG. 1 which is of the well-known DMOS type. A substrate, 10, of $n^+$-type conductivity material supports an epitaxial layer, 11, of $n^-$-type conductivity material. A portion, 12, of epitaxial layer 11 has been converted to p-type conductivity material through diffusion or ion implantation to form the MOSFET channel region resulting in a semiconductor pn junction between region 12 and remaining portions of layer 11. Within channel region 12, there is formed a $n^+$-type conductivity material source, 13, again typically by diffusion or ion implantation. Another semiconductor pn junction results between regions 12 and 13. Adjacent source region 13 is a contact region, 14, formed again by diffusion or ion implantation to have a $p^+$-type conductivity. Source region 13 is shorted to channel region 12 through connection region 14 by a metalization contact, 15, electrically contacting regions 13 and 14 at a major surface of the epitaxial layer, 16. A further metalization layer, 17, on the lower side of substrate 10 forms the drain contact.

A conductive material, typically doped polycrystalline silicon or "polysilicon," forms a gate, 18, over the separating space located in both major surface 16 and channel region 12 between the $n^-$-type conductivity portions of epitaxial layer 12 and source 13. Gate 18 is separated from channel region 12 by an oxide layer, 19, which surrounds gate 18 and which has an opening to permit source metalization 15 to reach major surface 16. Though not shown, a passivating layer would also be provided over terminal 15 and layer 19.

The MOSFET of the DMOS type shown in FIG. 1 can, in the "off" condition, prevent current flow only from drain terminal 17 having a positive voltage thereon with respect to source terminal 15, to that source terminal 15. Such a voltage reverse biases the pn junction between channel region 12 and the remaining portions of layer 11 and substrate 10 connected thereto through being supported thereon. Reversing the polarity of such a voltage will permit a current to flow through the device of FIG. 1 from terminal 15 to terminal 17 through regions 14, 12, 11 and 10 even though the gate voltage value is such that this transistor should be "off," which is an unsuitable characteristic for a switching transistor which is to be able to start and stop current flows in either direction. Furthermore, the "on" resistance of the device of FIG. 1 is sufficiently large to make this device unattractive in many circuit power supply situations. Finally, as can be seen, this is a vertical MOSFET in that, during operation currents flow from one major surface of the semiconductor material to the opposite surface. Thus, the device of FIG. 1 has some of the undesirable features described above.

Figure 2:
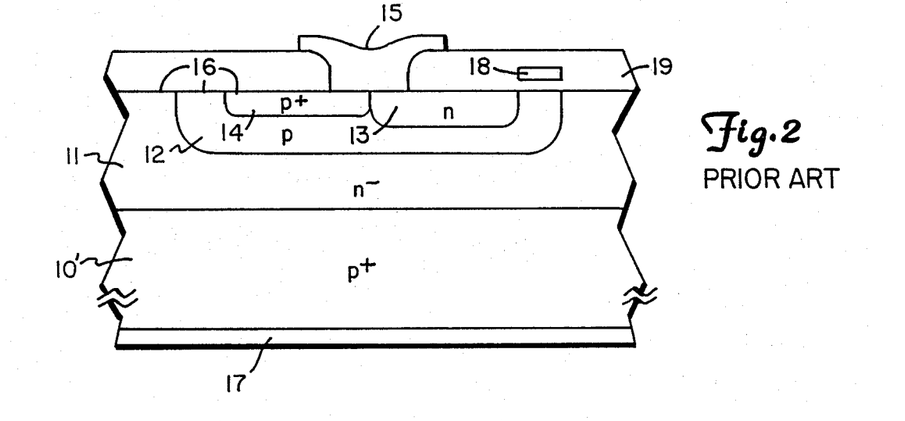
FIG. 2 shows a representation of a device also known in the prior art which is a modification of the device of FIG. 1.

The desire for obtaining a device for controlling substantial currents in the monolithic integrated circuit chip which has a lower "on" resistance than an ordinary MOSFET and yet is controlled by an insulated gate or MOSFET-like arrangement logic or sensing section of the chip has led to the development of further alternative circuit component devices. An improvement has been developed to overcome some of these deficiencies and it is shown in FIG. 2. FIG. 2 differs from FIG. 1 in having substituted p+-type conductivity material for the n+-type conductivity material used for substrate 10 in FIG. 1. As a result, substrate 10 of FIG. 1 is redesignated 10' in FIG. 2. The other designations remain the same for the corresponding structures in FIGS. 1 and 2.

The resulting device, often termed a conductivity modulated field-effect transistor or an insulated gate transistor, is sort of a combination of a MOSFET and a npnp four alternate conductivity type semiconductor layer thyristor device but modified to prevent "latch-up." The "latch-up" condition occurs where the gate loses any capability of switching the device into the "off" condition after a substantial current flow has been established therethrough. Such a "latch-up" condition occurs because of feedback actions in the current flows in the four layers, a situation usually modeled by an equivalent circuit having a pnp bipolar transistor and a npn bipolar transistor interconnected to one another in a feedback configuration. The collector of one is connected to the base of the other, the emitters of each forming the device terminating regions which, in the device of FIG. 2, are those connected to terminals 15 and 17.

In the device of FIG. 1, the "latch-up" condition is prevented by having terminal 15 serve as a short between n+-type conductivity region 13, serving as the emitter of the circuit model npn bipolar transistor, and regions 14 and 12, serving as the base of this npn bipolar transistor in the equivalent circuit model. This keeps current gains sufficiently low that sustained feedback activity in the current flows cannot be maintained.

Nevertheless, the FIG. 2 device operating condition rather closely approaches a "latch-up" condition for sufficient currrent being drawn through the MOSFET portion inherent in the structure with terminal 17 at a positive voltage, this inherent MOSFET being formed by regions 11 and 13, serving as the source and drain regions respectively, about the channel formed by region 12 under gate 18. This MOSFET draws sufficient current from region 11, serving as the base of the circuit model pnp bipolar transistor, to switch this transistor strongly into the "on" condition. Gate 18 stays fully in control of the current being carried between terminals 17 and 15 through setting the value thereof by the value of the gate voltage, over a wide range of operating conditions, so that the initiation and ceasing of the flows of such currents can be determined by applying the proper voltage to gate 18. Thus, the device of FIG. 2 has a lower "on" resistance because of the pnp transistor being saturated, and yet the device can be fully controlled even after substantial current begins flowing therethrough by voltages applied to gate 18 because a "latch-up" condition is prevented from occurring by the base-emitter junction of npn circuit model transistor being shorted by terminal 15.

A further advantage flows from substituting p+-type conductivity semiconductor material as substrate 10' in FIG. 2 for the n+-type conductivity material serving as substrate 10 in FIG. 1. That is, there is now the ability to block voltages between each of terminals 15 and 17, whatever the polarity, if gate 18 has placed the device in the "off" condition insofar as current flows between terminals. This is because of the semiconductor pn junction resulting between regions 10' and 11 which will be under a reverse bias voltage for a positive voltage at terminal 15 with respect to terminal 17. As a result, two of these devices can be connected in parallel with terminal 15 of one being connected to terminal 17 of the other to thereby provide a bilateral switching arrangement which can control current flows in either direction through this combination.

Thus, the device of FIG. 2 represents an improvement in reducing the "on" resistance to current flows therethrough between terminals 17 and 15 while retaining full capability to initiate and stop such flows at gate 18. In addition, voltages of either polarity can be blocked insofar as causing any current flow between terminals 17 and 15 in either direction if gate 18 has thereon voltages such as to maintain the device in the "off" condition. On the other hand, the device of FIG. 2 is still a vertical device in having the primary current flow terminals located on opposite sides of the semiconductor material provided therein.

Figure 3:
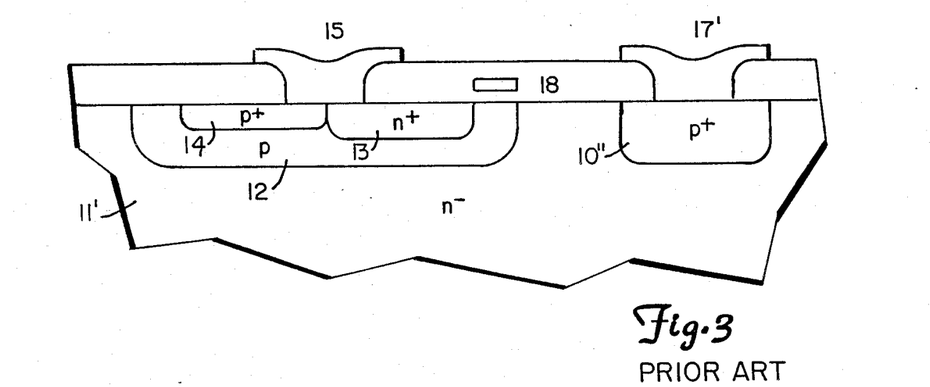
FIG. 3 shows a representation of a device also known in the prior art which is a modification of the device of FIG. 2.

This situation has been sought to be remedied by forming a lateral conductivity modulated field-effect transistor or insulated gate transistor, as shown in FIG. 3. Regions having a similar function in FIG. 3 retain the same designations as they had in FIGS. 1 and 2, such as regions 12, 13 and 14. Terminal 15 is again shorting together regions 13 and 14. Region 11 of FIG. 2 has become the entire substrate in FIG. 3 and so is redesignated 11'. The conductivity type region that had been substrate 10'in FIG. 2 has now been moved to the same major surface of the semiconductor material body to which terminal 15 is connected and so has been redesignated 10'' in FIG. 3. This region is connected by a terminal region at the major surface of the semiconductor material body and so is redesignated 17'.

The operation of this device is essentially that described for FIG. 2, and so this device has provided a solution to many of the difficulties which plague the device of FIG. 1. Nevertheless, the devices of FIGS. 2 and 3, though having a lower "on" resistance than the device of FIG. 1, still have an "on" resistance which is greater than that of a thyristor device "latched-up" in the "on" condition. Therefore, there remains a desire for a lateral current controlling device for monolithic integrated circuit chips having a relatively lower "on" resistance.

SUMMARY OF THE INVENTION

The present invention provides a bilateral switching device having a gate region and first and second terminating regions where the device is capable of conducting a current therethrough established by a signal and ended by an alternative signal at the gate, the device being formed in a semiconductor material body having a plurality of selected regions with an interior region in each separated from other portions of the semiconductor material body outside its corresponding selected region by that region, and a gate region formed over a separation space in such a separation region. Though there may be other gate regions over other such separation spaces, a gate region can be common to a plurality of such separation spaces.

DETAILED DESCRIPTION OF THE PREFERRED EMBODIMENTS

Figure 4:
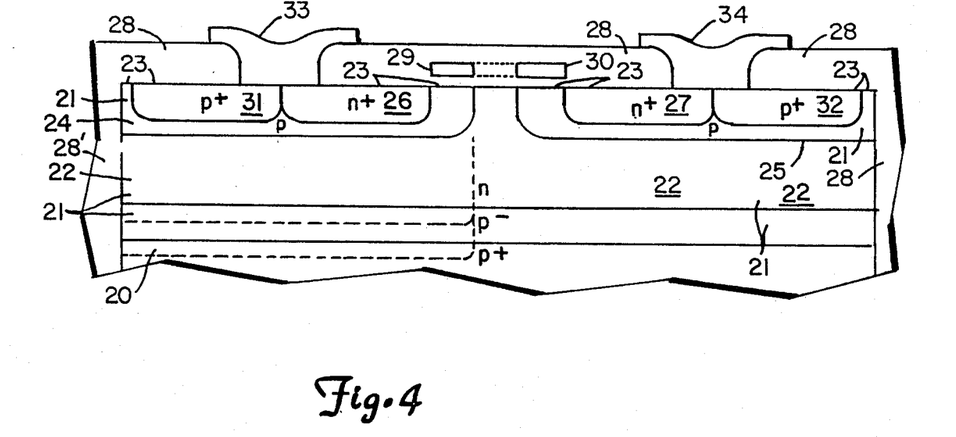
FIG. 4 shows a representation of the device of the present invention.

A device that is bilateral through having four or more alternating conductivity type semiconductor layers between its terminals with its primary terminating regions at a common surface of the semiconductor material body in which it is formed, and at which it exhibits symmetrical bidirectional current flow and blocking voltage capabilities, is shown in FIG. 4. The device shown is typically formed of doped silicon having boron distributed therein to provide a substrate, 20, of a $p^+$-type conductivity material having a resistivity of 0.2Ω - cm and with its upper major surface shown located in the [100] crystal plane of the silicon. A $p^-$-type conductivity boron doped silicon epitaxial layer, 21, is usually grown thereon in this embodiment having resistivity of 1 to 5 Ω - cm. A n-type conductivity region, 22, is typically provided in epitaxial layer 21 through ion implanting of phosphorous ions at a dose of $3 \times 10^{12}$ ions/cm² at an energy of 150 Kev, which results in a semiconductor pn junction between region 22 and remaining portions of layer 21 at a depth of 2 to 3 μm below the upper surface of layer 21.

Region 22 intersects the semiconductor material body major surface, 23, at the upper surface of layer 21, and has selected p-type conductivity regions, 24 and 25, therein which also intersect major surface 23. Regions 24 and 25 are usually formed essentially identical to one another, including in the depth of the pn junctions separating them from remaining portions of region 22 which at their deepest point, is approximately 0.5μm. They are typically each formed simultaneously by ion implanting boron ions in a dose of $8 \times 10^{12}$ ions/cm² at an energy of 60 Kev. Regions 24 and 25 are separated from one another in surface 23 at the semiconductor pn junction separating each from the remaining portions of region 22 by approximately 3 to 5 μm.

Each of regions 24 and 25 has a $n^+$-type conductivity region interior thereto typically formed by ion implantation of phosphorous or arsenic ions into regions 24 and 25 using a dose of $2.5 \times 10^{15}$ ions/cm² at an energy of 80 Kev for arsenic. This results in a semiconductor pn junction separating each such region from its corresponding one of regions 24 and 25 each having its greatest depth at 0.3μm below major while 23. These regions, 26 and 27, also intersect major surface 23 of the semiconductor material body, and there is a difference in the lateral position along surface 23 of (i) the semiconductor pn junctions separating each of regions 24 and 25 from the remaining portions of region 22, and (ii) the semiconductor pn junctions separating each of regions 26 and 27 from regions 24 and 25, respectively. These lateral position differences in corresponding ones of these junctions leave regions 26 and 27 separated from remaining portions of region 22 outside regions 24 and 25. This results in a separation space typically of 1 to 3μm in both major surface 23 and region 24 between the edge of region 26 formed by the semiconductor pn junction between regions 24 and 26, and the edge of region 24, formed by the semiconductor pn junction between region 24 and 22. Similarly, there is a separation space in both major surface 23 of a similar extent located in region 25 between the edge of region 27, formed by the semiconductor pn junction separating regions 27 and 25, and the edge of region 27 formed by the semiconductor pn junction between region 25 and other portions of region 22.

Each of these separating spaces has across portions of an electrically insulating layer, 28, formed primarily of silicon dioxide, a gate region, these being designated 29 and 30 in FIG. 4. These are each typically formed of polysilicon which has been doped with phosporus to the extent of $10^{19}$ atoms/cm³ to provide a resistivity of 0.01 Ω -cm. Gate regions 29 and 30 are typically separated from major surface 23 by portions of layer 18 having a thickness of 300 Å.

Regions 24 and 25 each have a further $p^+$-type conductivity connection region established therein adjacent to interior regions 26 and 27, these connection regions being typically formed by ion implantation with a dose of $5 \times 10^{14}$ ions/cm² at an energy of 100 Kev to thereby reach a depth below surface 23 of approximately 0.4 μm. Regions 31 and 32, are chosen to be of a higher conductivity than other portions of regions 24 and 25, respectively, for purposes of making an ohmic contact thereto.

Such ohmic contacts are usually provided by metal deposition interconnection network contacts, 33 and 34, with metal primarily being copper (4%) alloyed aluminum. Terminal 33 connects the interconnection network with an ohmic contact to both of regions 31 and 26, short circuiting or directly connecting these two regions together, and thereby provides a terminating region for the device of FIG. 4 comprising those portions with which terminal 33 is in contact. Similarly, terminal 34 places portions of the interconnection network in ohmic contact with both regions 32 and 27 to provide a short circuit or direct connection therebetween, and to form portions of each, those in ohmic contact with terminal 34, into another terminating region for the device of FIG. 4. None of the remaining portions of the interconnection network are shown in this figure.

Electrical insulating oxide 28 is shown having extensions on the right and on the left in FIG. 4 downward into the semiconductor material body below major surface 23. These extensions, designated 28' in FIG. 4, serve to provide "oxide isolation" or electrical isolation for the device of FIG. 4. This is necessary in the arrangement shown in FIG. 4 in which both p-type conductivity semiconductor material and n-type conductivity semiconductor material are shown adjacent to the isolation regions in which extensions 28' occur. This use of oxide isolation could be replaced by using junction isolation regions if, for instance, region 22 was chosen to surround regions 24 and 25 below major surface 23.

The structure shown in FIG. 4 can readily be made in a fabrication process which also provides bipolar transistors in monolithic integrated circuits fabricated primarily on the basis of complementary metal-oxide-semiconductor (CMOS) technology in which the primary active elements are formed by pairs of n-channel and p-channel MOSFET's. Thus, region 22 would be formed by the "n-well" in which p-channel MOSFET's would be fabricated (the n-channel MOSFET's being fabricated directly in epitaxial layer 21 at locations where implantation formed region 22 has not been provided). Regions 24 and 25 would be formed simultaneously with the formation of bases for the vertical npn bipolar transistors. Regions 26 and 27 would be formed simultaneously with emitters for the vertical npn bipolar transistors and with sources and drains for the n-channel MOSFET's. Regions 31 and 32 would be formed simultaneously with the interconnection portions of bases for the npn bipolar transistors and with sources and drains of the p-channel MOSFET's.

In FIG. 4, the restricting of penetration of the implanted ions in the ion implantation step used in forming region 22 is done so that the remaining portion of epitaxial layer 21 retains its initial $p^-$-type conductivity. This is done to increase the breakdown voltage between region 22 and the remaining portion of region 21 thereby not converted to n-type conductivity located adjacent to substrate 20. If this higher breakdown voltage is not necessary, region 22 could extend down to region 20. Alternatively, if this device need not necessarily to be compatible with CMOS technology, the entire substrate could be formed of $p^-$-type conductivity so that no epitaxial layer need be provided. The presence of a $p^-$-type conductivity portion adjacent region 22 also reduces junction capacitance thereby increasing the switching speed of the device in the current switching operation to be described below.

Figure 5:
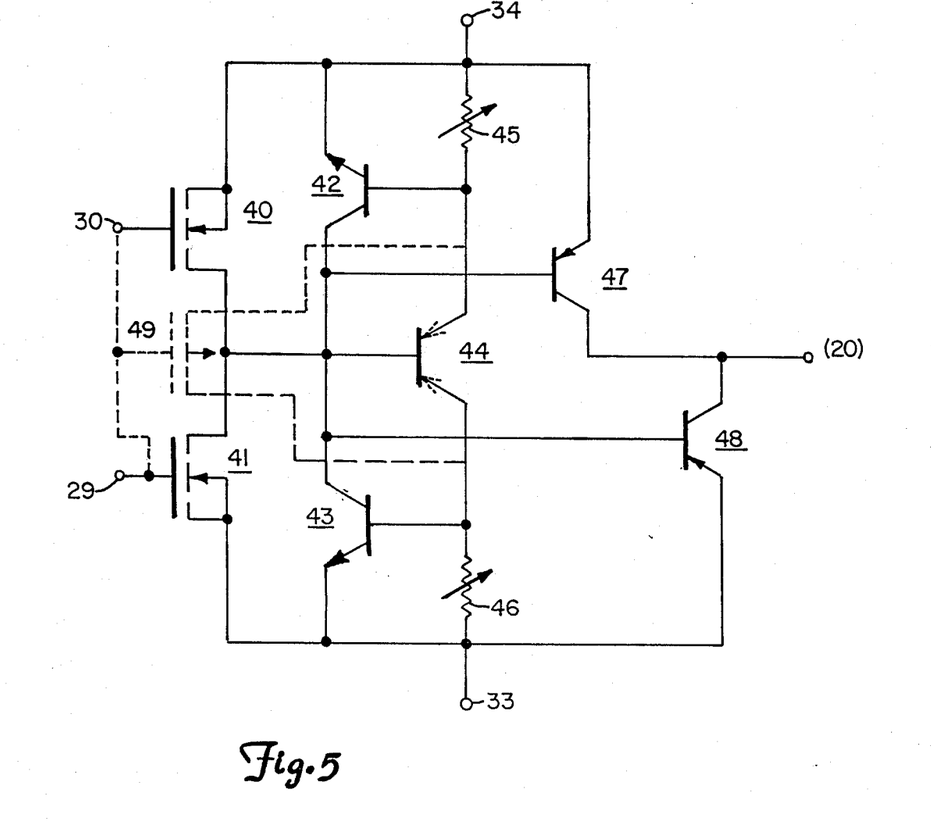
FIG. 5 shows an equivalent circuit schematic diagram of the device of FIG. 4.

This switching operation is more easily understood if the equivalent circuit model for the device of FIG. 4, shown in FIG. 5, is used as part of the description. Each of gates 29 and 30 are part of an equivalent n-channel MOSFET shown in FIG. 5, these two MOSFET's being connected in series with one another between terminals 33 and 34 in FIG. 4. Each of these MOSFET's is shown to be of the DMOS type (though need not be, but if used gives a short channel for these MOSFETS), having a channel region thereof electrically connected to a terminating region of the MOSFET which serves as a source.

One MOSFET in FIG. 5, 40, having gate 30 associated therewith, is formed of $n^+$-type conductivity region 27 as one terminating region thereof, and n-type conductivity region 22 as the other terminating region thereof. The channel region is formed by p-channel conductivity region 25 and $p^+$-type conductivity region 32 which together are directly connected by terminal 34 to region 27.

The remaining MOSFET in FIG. 5, 41, having gate 29 as a portion thereof, is formed with one of its terminating regions being provided by $n^+$-type conductivity region 26 and the other again by n-type conductivity region 22. The channel region for this MOSFET is formed by p-channel conductivity region 24 and $p^+$-type conductivity region 31, these two regions being directly connected by terminal 33 to region 26. Thus, the substrate or channel regions for each of these MOSFET's is directly connected to a corresponding one of terminals 33 and 34.

The structure of FIG. 4 also provides several effective bipolar transistors. A npn bipolar transistor, 42, is shown in FIG. 5. One of the terminating regions for this bipolar transistor, serving as its emitter, is formed by $n^+$-type conductivity region 27, and the collector is formed by n-type conductivity region 22. The base for transistor 42 is formed by p-type conductivity region 25. Thus, this is a vertical npn bipolar transistor in the structure of FIG. 4.

Similarly, another npn bipolar transistor 143, is shown in FIG. 5. The emitter region of this bipolar transistor will be formed by $n^+$-type conductivity region 26 and the collector will be formed by n-type conductivity region 22. The base for transistor 43 is formed by p-type conductivity region 24. Transistor 43 is also a vertical npn bipolar transistor in the structure of FIG. 4. Note that lateral npn bipolar transistors are, in addition, formed near surface 23 by these regions forming vertical transistors 42 and 43. These will have little effect since they are of a very low current gain because the base regions thereof beneath gates 29 and 30 are relatively wide.

A lateral pnp bipolar transistor in FIG. 5, 44, is also formed in the structure of FIG. 4 from the common terminating region of bipolar transistors 42 and 43, that being n-type conductivity region 22, and from the base regions of each of transistors 42 and 43. That is, transistor 44 in FIG. 5 has region 22 in FIG. 4 as its base region, and has p-type conductivity regions 24 and 25 in that figure as the terminating regions of this bipolar transistor if these two regions are sufficiently close to one another to provide bipolar transistor action. Regions 24 and 25 will serve as either an emitter or a collector for transistor 44 depending on the polarities of the voltages applied between terminals 33 and 34. Again, this is reflected in FIG. 5 by having emitter arrows in dashed lines present on each of the terminating region leads emanating from transistor 44.

These terminating region leads from transistor 44 are shown in FIG. 5 each going to a resistor which in turn is connected to a corresponding one of terminals 33 and 34. This occurs since the terminating regions for transistor 44, as formed by regions 24 and 25, are effective, at least initially, primarily near the separating spaces in regions 24 and 25 included in major surface 23. However, terminating regions for transistor 44 are electrically connected to terminals 33 and 34 through regions 31 and 32, respectively, near those sides of regions 26 and 27, respectively, which are opposite those sides of regions 26 and 27 adjacent to these separating spaces. Thus, there is a relatively long current flow path through regions 24 and 25 and then through regions 31 and 32, respectively, before terminals 33 and 34 are reached by currents flowing in regions 24 and 25 near the separating spaces. These long current paths provide a significant amount of electrical resistance to current flows, and so the current flow paths in regions 24 and 25 are each represented in FIG. 5 by a resistor.

These are shown as variable resistors because the resistance values depend on current flow conditions in these regions. The high resistance current path in region 25 going from near the separating space therein occurring in major surface 23 to terminal 34 (the low resistance path will be described below in connection with the description of operation) comprises the distance along region 27 and through region 32 to terminal 34 to form one FIG. 5 variable resistor, 45, in its high resistance variation. The high resistance current path in region 24 from near the separating space therein included in major surface 23 is along region 26 and through region 31 to terminal 33 to form the remaining FIG. 5 variable resistor, 46, in its high resistance variation.

Since substrate 20 in FIG. 4 will have an electrical terminal means connected thereto for connection to an external voltage source, two further vertical pnp bipolar transistors must be added to the circuit of FIG. 5 for it to be an equivalent circuit model for the device of FIG. 4. The first of these pnp bipolar transistors, 47, has its emitter formed by p-type conductivity region 25, its base formed by n-type conductivity region 22, and its collector formed by the remaining $p^-$-type conductivity portion of layer 21 together with $p^+$-type conductivity substrate 20. The external connection to substrate 20 is indicated in FIG. 5 by (20) near this substrate terminal. The remaining pnp bipolar transistor, 48, has its emitter formed by p-type conductivity region 24, its base formed by n-type conductivity region 22, and its collector formed by the remaining $p^-$-type conductivity portion of layer 21 together with $p^+$-type conductivity substrate 20.

As a basis for describing the operation of the structure of FIG. 4 and the equivalent circuit of FIG. 5, assume substrate 20 to be connected to a ground reference voltage. Since the device is bilateral in operation, the description for positive voltage at terminal 34 (usually applied through a load device) with terminal 33 also connected to a ground reference would be identical to the description which would be provided for reversing these connections of terminals 33 and 34. Initially, at least, consider terminal 30 as also being connected to the ground reference potential.

A control voltage signal is applied to terminal 29 in FIGS. 4 and 5. As this voltage is increased past the threshold voltage of MOSFET 41, MOSFET 41 switches into the "on" condition and injects electrons into the terminating region thereof connected to MOSFET 40 in FIG. 5, i.e. into n-type conductivity region 22 of FIG. 4. These electrons lower the potential of region 22 to forward bias the semiconductor pn junction between region 22 and p-type conductivity region 25. In this way, a current flow (due to electron flow) is provided through MOSFET 41 from the base of lateral pnp transistor 44 to terminal 33 at ground reference potential. Similarly, a current path is provided from the base of transistor 47 through MOSFET 41 to terminal 33. As a result, holes are injected into region 22. Part of the injected holes are collected by substrate 20 serving as the collector of vertical transistor 47, and the remaining part of these injected holes are collected by p-type conductivity region 24 serving as the collector of lateral transistor 44. Region 24 also serves as resistor 46 in the base of transistor 43. That is, bipolar transistors 44 and 47 begin to switch into the "on" condition.

The current provided by bipolar transistor 44, in the form of holes being injected into region 24, flows through resistor 46, as indicated, and out terminal 33. The current causes a voltage drop across region 24, i.e. resistor 46, as currents flow along region 24 past and under $n^+$-type conductivity region 26 and into $p^+$-type conductivity region 31 to terminal 33 in FIG. 4. In these circumstances, the high resistance value for resistor 46 is encountered by this current flow, and this voltage drop quicky grows to exceed the threshold value of the emitter-base junction of transistor 43.

As this occurs, the current being supplied by bipolar transistor 44, beyond that needed to raise the voltage drop across resistor 46 to this threshold value, will be shunted into the base of transistor 43 and across the forward biased semiconductor pn junction separating region 24 from region 26 in FIG. 4, i.e. into the base and out the emitter of bipolar transistor 43. The result is that transistor 43 begins to switch into the "on" condition drawing further current from the base of transistor 44 which in turn supplies further current to the base of transistor 43 so that a regenerative process ensues. Transistors 43 and 44 will go into "latch-up" operation as a result of this regenerative process if the effective common base current gains of each summed together exceed the value 1 as is well known in transistor and four layer device theory.

The common base current gain of transistor 43 will itself be increased by the additional current supplied to the base thereof as the voltage across resistor 46 exceeds the threshold value of the base-emitter junction of that transistor as is well known in semiconductor device theory. The common base current gain of transistor 44 is also increased by the current drawn out of its base from MOSFET 41. Thus, the common base current gains of transistors 43 and 44 will increase until their sum equals 1 so that transistors 43 and 44 together then go into the "latch-up" condition, each forcing base current from the other to thereby switch that other strongly into the "on" condition.

At this point, this "latch-up" condition will continue so long as MOSFET 41 continues to draw current from the base of transistor 44 to keep its common base current gain sufficiently large. In these circumstances, the current flowing from terminal 34 through resistor 45 and then through transistors 44 and 43 and out terminal 33 will take on values which are independent of the voltage applied to gate 29 of MOSFET 41. That is, the current flow will be determined by the external load device connected between terminal 34 and the positive voltage supply. A termination of this current flow will, of course, allow transistors 43 and 44 to come out of the "latch-up" condition.

However, this is not the only control over the continuation of the "latch-up" condition in transistors 43 and 44 - switching MOSFET 41 into the "off" condition so that it does not continue to draw current from bipolar transistor 44 will have the same effect of terminating the "latch-up" condition of transistors 43 and 44. Thus, control of current flows between terminals 34 and 33 through transistors 43 and 44 is maintained, in the switching on and off sense, by the voltage at gate 29 of MOSFET 41 insofar as this current flow can be permitted, or terminated if flowing, by the choice of value for the voltage applied at gate 29.

The voltage drop which occurs between terminals 34 and 33, if the device of FIG. 4 is switched into the "on" condition by the voltage applied at gate 29, is determined by the voltage drop across transistors 44 and 43 in the "latch-up" condition and the voltage drop across resistor 45. The voltage drop across transistors 43 and 44 in the "latch-up" condition will be lower than the voltage drop across the devices shown in FIGS. 2 and 3 in comparable circumstances, because the "latch-up" condition is actively prevented in those devices because of the shorting of regions 13 and 14 together therein by terminal 15, as described above, which is done to avoid the occurrance of a "latch-up" condition. Allowing transistors 43 and 44 to go into the "latch-up" condition allows each of them to force the other much further into the "on" condition (thereby lowering the "on" resistance across them significantly) than can the npn and pnp bipolar transistor equivalents for the devices of FIGS. 2 and 3 which are prevented from going into the "latch-up" condition. Thus, the voltage drop across transistors 43 and 44 in the "latch-up" condition will be quite low because of this relatively low "on" resistance.

However, if the resistance value of resistor 45 was the high value taken by resistor 46 in the present conditions, there would be a very substantial voltage drop across resistor 45 for significant currents flowing therethrough leading to a relatively high voltage drop across the device of FIG. 4. Happily, that is not the situation for resistor 45 because in these circumstances the resistance value of resistor 45 will be at its low rather than at the high value taken by resistor 46 in these conditions. That is, the current path for currents entering terminal 34, and so regions 32 and 25, will be spread across a large portion of the forward biased semiconductor pn junction separating region 25 from region 22, and will flow particularly across the portion of that junction near region 32 because that portion will be more strongly forward biased than other portions. Thus, there is a relatively short path and correspondingly low resistance through region 25 to region 22 for these substantial currents to flow. Furthermore, there are many paths because, as stated, much of the junction will carry this current flow thereacross, which in effect provides many parallel paths to thereby further reduce this resistance value which effectively is taken by resistor 45.

In contrast, bipolar transistor 44, in being switched into the "on" condition as described above, has the currents therethrough initially flowing from the portion of region 25 under gate 30, then through region 22 to the portion of region 24 under gate 29. As a result, this current, to reach terminal 33, must take the longer current path through region 24 along region 26 and into region 31 so that this initial current flow encounters the higher resistance condition in region 24, i.e. resistor 46 is in the higher resistance condition while resistor 45 is in the lower resistance condition. As a result of resistor 45 being effectively in the lower resistance value condition, the "on" condition voltage drop, and the "on" resistance value, are both kept relatively low for the device of FIG. 4.

Thus, the proper geometrical construction and doping concentration levels for regions 24 and 25 are important to the proper operation of the device of FIG. 4. If the current path in the maximum resistance situation is too long, or has too great a resistivity, such that the effect of resistance value of resistor 46 is too large, there will be little difficulty in switching the device to the "on" condition so that transistors 43 and 44 go into the "latch-up" condition, but there will be substantial difficulty in assuring that switching MOSFET 41 to the "off" condition will lead to a termination of this "latch-up" condition. On the other hand, if the resistance value for resistor 46 is too small, there may not be sufficient current drawn by MOSFET 41, and so supplied by bipolar transistor 44, to switch transistor 43 into the "on" condition. The resistance values of regions 24 and 25 are controlled in the same way that a "pinch" resistor is controlled in that the doping level of regions 24 and 25, and the extent of regions 26 and 27 therein, respectively, control the effective resistance values.

There is a further factor in assuring that transistors 43 and 44 can be placed in the "latch-up" condition. That factor is the amount of current shunted from terminal 34 by pnp transistor 47 to substrate terminal 20 in FIG. 5. To the extent that the gain of transistor 47 (and transistor 48 for reversed voltage polarity on terminals 33 and 34) can be lowered, the more current will be available through bipolar transistor 44 to switch bipolar transister 43 into the "on" condition.

One way to lower the gain of bipolar transistors 47 and 48 would be to replace the remaining $p^-$-type conductivity portion of layer 21 in FIG. 4 with a $n^+$-type conductivity "buried layer" region. While this does reduce the gain of either of transistors 47 and 48, there is a penalty in that the breakdown voltage between terminals 33 and 34 and substrate terminal 20 is also reduced.

Another condition required to assure that transistors 43 and 44 can be placed into the "latch-up" condition is that sufficient current is drawn by MOSFET 41 from the base of transistor 44. This requires that MOSFET 41, and MOSFET 40 if symmetrical operation is to be maintained, be designed with sufficient width to length ratios to assure that each can sink an adequate amount of current for this purpose. Since the length parameter for these MOSFET's is fixed to a certain extent by the minimum structural feature size permitted by the lithography steps used in fabricating the structure of FIG. 4, the primary variable which can be controlled in the width to length ratio requirement is the width of the channel in and out of the plane of the paper of FIG. 4 under gates 29 and 30.

The operation description was given with gate 30 connected to ground. This assured that MOSFET 40 was in the "off" condition during the sequence of operation described and would not be a factor in that operation. However, a much more convenient possibility exists for controlling the device of FIG. 4 which is suggested by the dashed lines shown between gates 29 and 30 therein. That is, gates 29 and 30 can be a single gate structure (designated 29,30) extending from the left-hand edge of gate 29 to the right-hand edge of gate 30 in FIG. 4. This has the effect of electrically connecting gate 30 to gate 29 for purposes of the above description rather than connecting it to ground.

Before a positive control voltage is applied to gate structure 29,30 in operation, both will be in the "off" condition for positive voltage connected through a load to terminal 34 with terminal 33 connected to the ground reference voltage. After a positive voltage is supplied to gate 29 which reaches a value sufficient to place the structure of FIG. 4 in the "on" condition, by having transistors 43 and 44 placed in the "latch-up" condition, both MOSFET's 40 and 41 will be in the "on" condition with the "on " condition voltage between terminals 34 and 33 applied across these MOSFET's in series. These MOSFET's, in the "on" condition, thus further lower the "on" resistance of the device of FIG. 4 in the "on" condition by being in parallel with the current path through transistors 43 and 44. The combining of gates 29 and 30 into a single structure also provides a simpler connection requirement for the control signals to be used in controlling the device of FIG. 4.

A further advantage comes because the forming of a single gate structure 29,30 from the left-hand edge of gate 29 to the right-hand edge of gate 30 yields a further p-channel MOSFET, 49, being provided, which is shown in the equivalent circuit of FIG. 5 in dashed lines corresponding to the dashed lines indicating a single gate structure for gates 29 and 30 in FIG. 4. The terminating regions of transistor 49 are formed by the p-type conductivity regions 24 and 25 in FIG. 4 near the separating spaces under gates 29 and 30, respectively, and the channel region is formed by n-type conductivity region 22. The single gate structure 29,30 formed from the left-hand edge of gate 29 to the right-hand edge of gate 30 serves as a gate for MOSFET 49.

The presence of MOSFET 49 permits switching the device of FIG. 4 into the "on" condition with the use of a voltage control signal on the combined gate structure 29,30 which is negative with respect to the ground reference voltage provided at terminal 33. That is, a negative voltage control signal on combined gate structure 29,30, which is in excess of the threshold voltage of transistor 49, will switch transistor 49 into the "on" condition drawing current through resistor 45 and conducting same into resistor 46 to begin the placing of transistors 43 and 44 into the "latch-up" condition. This current can be made sufficient to raise the common base current gain of transistor 43 so that the sum of the common base current gains of both transistors 43 and 44 will exceed one to permit "latch-up" to occur.

Again, for a reversal of voltage polarity between terminals 34 and 33, the same description of the operation of the structure of FIG. 4 and the circuit of FIG. 5 can be given since the combining of gates 29 and 30 into a single combined gate structure 29,30 does not change the symmetry of the device in FIG. 4. Hence, the structure in FIG. 4 can control alternating polarity voltages provided to one of terminals 33 and 34 with respect to the other, can control current in each direction flowing between these terminals, and can use either a positive voltage or negative voltage control signal to do so.

The structure of FIG. 4 is shown entirely symmetrical. However, there need not be such symmetry even though still having a device which is capable of controlling currents in either direction between terminals 33 and 34. One alternative is to have p-type conductivity region 24 extend through n-type conductivity region 22 all the way into the remaining p⁻-type conductivity portion of layer 21, or even further to substrate 20. Alternatively, p⁻-type conductivity region remaining portion 21 could be eliminated altogether so that region 22, although perhaps with a reduced conductivity to the point of being an n⁻-type conductivity region, is directly against substrate 20 with region 24 again extending thereto. Such an extension is indicated in FIG. 4 by the alternating short and long dashed line indicating this extension of region 24 into the remaining p⁻-type conductivity portion of layer 21, or alternatively a further such dashed line indicating an extension all the way to substrate 20.

In the situation where terminal 34 is positive with respect to terminal 33, the increased size of region 24 will reduce the resistance occurring therein and so occurring in the base region of the equivalent npn bipolar transistor of which it is a part. On the other hand, a larger current will be available thereto since the current to substrate 20 from terminal 34 will now be collected in this same region 24 by virtue of its being electrically in a common region with substrate 20 due to its intersection therewith. This will provide additional design freedom in adjusting the voltage which must be applied at gate 29 to cause this structure in FIG. 4 to switch into the "on" condition.

For a reversal in the voltage polarities on terminals 33 and 34, the structure would again have the higher value of base resistance for the current path in region 25, but the transistor from terminal 33 is eliminated so again there is not the current loss from this terminal by transistor action though there will be a base resistive current loss to the substrate terminal. Thus, there is again an opportunity to select the value for the voltage applied to gate 30 which switches this version of the device of FIG. 4 into the "on" condition, a value which can differ from that selected for gate 29.

Figure 6:
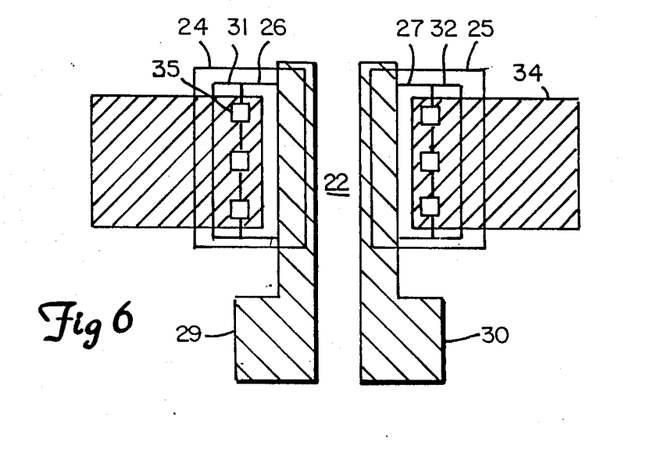
FIG. 6 shows a layout of the device shown in FIG. 4.

FIG. 6 shows a layout for the device of FIG. 4 below and on major surface 23, this being a view looking downward onto FIG. 4. As indicated above, the structure shown in FIG. 4 and in FIG. 6 is shown without a final passivation layer thereover, and further, the metal interconnection system portions leading from terminals 33 and 34 are not shown at all in FIG. 4 although they are to some extent in FIG. 6. There is also no use in FIG. 6 of dashed lines to indicate structural features which are covered or hidden by other structural features. Further, these figures are not necessarily drawn to scale or have their features in actual proportion to one another, rather, they are representational for aiding the reader in understanding what is occurring as opposed to providing geometrically accurate drawings.

The designations used for the device structural features in FIG. 4 have been continued in FIG. 6 for the same structural features. In addition, shading has been used to distinguish structural features from one another. The complete symmetry of the device of FIG. 4 can be seen clearly in FIG. 6.

Figure 7:
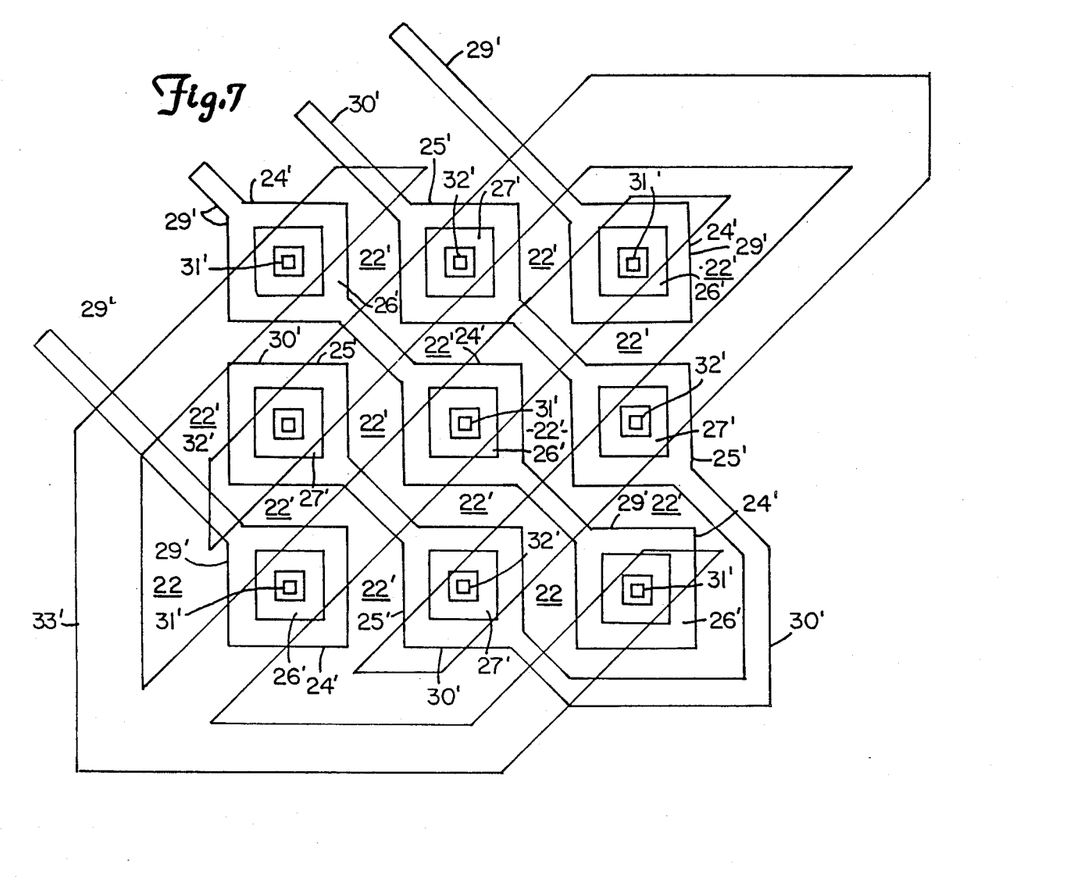
FIG. 7 shows a layout for a device which combines multiples of the device of FIG. 4.

The "on" resistance of the device of FIGS. 4 and 6 can be significantly reduced by providing multiple FIGS. 4 and 6 structures to increase the number of current paths in parallel. Such an arrangement is shown in FIG. 7. The structures are designated in FIG. 7 with numerals used in connection with FIGS. 4 and 6 but with prime marks added to indicate that the designated structures represent adaptations from the structures of FIGS. 4 and 6 to the arrangement of FIG. 7.

A serpentine interconnected collection of hollow rectangles is marked 30', and each such rectangle corresponds to a gate 30 over a similar rectangle of p-type conductivity material 24 in FIG. 4, but together serving as regions 25'. A similar statement is true for those hollow rectangle structures marked 29' (which would be connected together in a finished diagram) each of which represents a gate over a similarly shaped p-type portion of semiconductor material serving as regions 24'.

Each of the regions of p-type semiconductor material 25' covered by a portion of gate 30' surrounds a n⁺-type conductivity region 27' which in turn surrounds a p⁺-type conductivity region 32'. Similarly, each p-type conductivity region 24' under hollow rectangle portion of gate structure 29' surrounds a n⁺-type conductivity region 26' which in turn surrounds a p⁺-type conductivity region 31'. Those regions 26' and 31', associated with gate structure 29', are electrically interconnected by a metalization structure 33' which shorts each region 31' to each region 26'. Another metalization structure 34' electrically interconnects and shorts each region 32' to each region 27'.

As can be seen from this arrangement of FIG. 7, an arrangement which can be laterally extended indefinitely to provide as low an "on" resistance as desired subject to the constraint of the size of the monolithic integrated circuit chip, each terminal connection point to one of interconnection arrangements 33' or 34' is in practice surrounded by neighboring interconnection points made to the other interconnection arrangement. Thus, a region 24' under a hollow rectangular gate structure 29' has on each side thereof, across a region of n-type conductivity material 22', a neighboring p-type conductivity structure 25'. The interaction in the structure of FIG. 7 between (i) such a structure 24', and the n+-type conductivity region 26' interior thereto surrounding a p+-type conductivity region 31', on the one hand, and (ii) the neighboring p-type conductivity regions 25', and the n+-type conductivity region 27' interior thereto surrounding a p+-type conductivity region 32', is essentially the same as the interaction of the structure in FIG. 4 between (a) region 24, and in region 26 interior thereto adjacent to region 31, and (b) region 25, including region 27 interior thereto and adjacent region 32. Since, as indicated above, this arrangement could be spread indefinitely, the additional current paths due to these interactions between an interconnection point and its nearest neighbors clearly will provide additional current paths in parallel to thereby effectively reduce the "on" resistance of the device of FIG. 7.

Although the present invention has been described with reference to preferred embodiments, workers skilled in the art will recognize that changes may be made in form and detail without departing from the spirit and scope of the invention.

What is claimed is:

1. A bilateral switching device having a gate region and first and second terminating regions each of which can serve as an anode and a cathode thereof, said switching device, if electrically energized, being capable of conducting, as a primary current flowing therethrough, a load current flowing between said first and second terminating regions which can be established by providing a signal beyond an initial value to said gate with said load current after such establishment having a magnitude substantially independent of such signal over a substantial range of signal values, and which after such establishment can be ended by providing an alternative signal value to said gate, said device comprising:

a semiconductor material body of a first conductivity type and a first conductivity, except in selected characteristic regions thereof, and having a first major surface;

a plurality of said characteristic regions intersecting said first major surface in a first major surface portion, including first and second characteristic regions, which are spaced apart from one another in said semiconductor material body and so spaced apart in said first major surface portion, said plurality of characteristic regions each being of a second conductivity type and of a second conductivity in selected portions thereof to result in each forming a corresponding characteristic region pn junction with other portions of said semiconductor body material, where a portion of each such junction is on a side of its associated characteristic region that is opposite said first major surface portion;

a plurality of selected contact portions in said semiconductor material body each intersecting said first major surface portion, including first and second contact portions, with each of said plurality of contact portions being part of a corresponding one of said plurality of characteristic regions but of a third conductivity greater than said second conductivity of those remaining portions of its corresponding said characteristic region, said first contact portion being in said first characteristic region and said second contact portion being in said second characteristic region;

a plurality of selected interior regions in said semiconductor material body each intersecting said first major surface portion, including first and second interior regions, with each of said plurality of interior regions being contained within a corresponding one of said plurality of characteristic regions through being surrounded thereby in said semiconductor material body to form a corresponding interior region pn junction about that interior region also intersecting said first major surface portion and having a portion thereof paralleling said portion of its corresponding said characteristic region pn junction but separated therefrom by a control resistive portion of that characteristic region located therebetween, and with each such interior region being spaced apart from other portions of said semiconductor material body outside its corresponding said characteristic region to result in also being spaced apart from such other portions of said semiconductor material body by a separating space in said first major surface portion which is also in its corresponding said characteristic region, said first interior region being within said first characteristic region and said second interior region being within said second characteristic region, said plurality of interior regions each being of said first conductivity type with said first terminating region including at least portions of said first interior region and said first contact portion and with said second terminating region including at least portions of said second interior region and said second contact region; and said gate region being formed of a conductive material and located across an electrical insulating material from at least a portion of that said separating space occurring in said first selected region, and with conductivities of each control resistive portion, lengths in total of said interior region pn junctions in said first major surface adjacent a said separating space, thicknesses of said control resistive regions and widths of said separating spaces together having values which permit signals at said gate region to establish and end load currents as aforesaid.

2. The apparatus of claim 1 wherein said gate region is also located across an electrical insulating material from at least a portion of that separating space occurring in said second characteristic region.

3. The apparatus of claim 1 wherein said gate region is a first gate region, and wherein there is a second gate region formed of a conductive material and located across an insulating material from at least a portion of that separating space located in said second characteristic region.

4. The apparatus of claim 1 wherein said semiconductor material body has an additional characteristic region spaced apart from both said first major surface portion and from said second characteristic region,.

5. The apparatus of claim 1 wherein each of said plurality of characteristic regions is located at an intersection of a mesh pattern in said first major surface portion.

6. The apparatus of claim 1 wherein a first interconnection termination means is electrically connected to those said portions of said first interior region and said first contact portion forming said first terminating region as aforesaid.

7. The apparatus of claim 4 wherein said first characteristic region is also spaced apart in said semiconductor material body from said additional characteristic region.

8. The apparatus of claim 4 wherein said first characteristic region intersects said additional characteristic region.

9. The apparatus of claim 1 wherein said first contact portion at least partly surrounds said first interior region in said first major surface portion.

10. The apparatus of claim 1 wherein said first contact portion is at least partly surrounded by said first interior region in said first major surface portion.

11. The apparatus of claim 1 wherein said mesh pattern follows a mesh pattern of orthogonal lines.

12. The apparatus of claim 5 wherein each said contact portion in said plurality of contact portions is surrounded in its corresponding said characteristic region by that said interior region also located therein such that said first contact portion is surrounded by said first interior region in said first major surface portion.

13. The apparatus of claim 6 wherein a second interconnection termination means is electrically connected to those said portions of said second interior region and said second contact portion forming said second terminating region as aforesaid.

14. The apparatus of claim 9 wherein said second contact portion at least partly surrounds said second interior region in said first major surface portion.

15. The apparatus of claim 9 wherein said semiconductor material body portions of said first conductivity type at least partly surround said first characteristic region in said first major surface portion.

16. The apparatus of claim 9 wherein a first interconnection termination means is electrically connected to those said portions of said first interior region and said first contact portion forming said first terminating region as aforesaid.

17. The apparatus of claim 10 wherein said second contact portion is at least partly surrounded by said second interior region in said first major surface portion.

18. The apparatus of claim 10 wherein said semiconductor material body portions of said first conductivity type at least partly surround said second characteristic region in said first major surface portion.

19. The apparatus of claim 10 wherein a first interconnection termination means is electrically connected to those said portions of said first interior region and said first contact portion forming said first terminating region as aforesaid.

20. The apparatus of claim 12 wherein said semiconductor material body portions of said first conductivity type entirely surround, in said first major surface portion, each of said plurality of characteristic regions.

21. The apparatus of claim 15 wherein said semiconductor material body portions of said first conductivity type entirely surround said first characteristic region in said first major surface portion.

22. The apparatus of claim 16 wherein a second interconnection termination means is electrically connected to those said portions of said second interior region and said second contact portion forming said second terminating region as aforesaid.

23. The appartus of claim 16 wherein said first terminating region includes at least a portion of said first contact portion.

24. The apparatus of claim 18 wherein said semiconductor material body portions of said first conductivity type entirely surround said second characteristic region in said first major surface portion.

25. The apparatus of claim 19 wherein a second interconnection termination means is electrically connected to those said portions of said second interior region and said second contact portion forming said second terminating region as aforesaid.

26. The appartus of claim 19 wherein said first terminating region includes at least a portion of said first contact portion.

27. The apparatus of claim 20 wherein said gate region is a first gate region, and any characteristic region in said plurality thereof, including said first characteristic region, which has said first gate region located across an electrically insulating material from that said separating space occurring therein, as aforesaid, also has its immediately neighboring characteristic regions in said mesh pattern, including said second characteristic region, having a common second gate region, said second gate region being formed of a conductive material and located across electrical insulating material from at least a portion of that said separating space occurring in each of said neighboring characteristic regions.

28. The apparatus of claim 20 wherein a first interconnection termination means is electrically connected to those said portions of said first interior region and said first contact portion forming said first terminating region, and wherein any characteristic region in said plurality thereof, including said first characteristic region, which has said first interconnection termination means electrically connected to portions of that contact portion therein and to portions of that interior region located therein, as aforesaid, also has its immediately neighboring characteristic regions in said mesh pattern, including said second characteristic region, having a common second termination means, said second termination means being electrically connected to portions of that contact portion in each of said neighboring characteristic regions and to portions of its corresponding interior region.

29. The apparatus of claim 22 wherein said second terminating region includes at least a portion of said second contact portion.

30. The apparatus of claim 25 wherein said second terminating region includes at least a portion of said second contact portion.

* * * * *

UNITED STATES PATENT AND TRADEMARK OFFICE
CERTIFICATE OF CORRECTION

PATENT NO. : 4,947,226
DATED : August 7, 1990
INVENTOR(S) : Jack S. T. Huang et al.

It is certified that error appears in the above-identified patent and that said Letters Patent is hereby corrected as shown below:

On the title page:

Delete [73] Assignee: Hoenywell, Inc., Minneapolis, Minn.

Insert [73] Assignee: Honeywell, Inc. Minneapolis, Minn.

Signed and Sealed this

Fifth Day of November, 1991

Attest:

HARRY F. MANBECK, JR.

Attesting Officer

Commissioner of Patents and Trademarks